US010784174B2

(12) United States Patent
Kabouzi et al.

(10) Patent No.: US 10,784,174 B2
(45) Date of Patent: Sep. 22, 2020

(54) METHOD AND APPARATUS FOR DETERMINING ETCH PROCESS PARAMETERS

(71) Applicant: Lam Research Corporation, Fremont, CA (US)

(72) Inventors: Yassine Kabouzi, Fremont, CA (US); Luc Albarede, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 15/783,301

(22) Filed: Oct. 13, 2017

(65) Prior Publication Data
US 2019/0115267 A1    Apr. 18, 2019

(51) Int. Cl.
| H01L 21/66 | (2006.01) |
| H01L 21/67 | (2006.01) |
| H01J 37/32 | (2006.01) |
| G01N 21/3504 | (2014.01) |
| H01L 21/3065 | (2006.01) |
| H01L 21/311 | (2006.01) |
| H01L 21/3213 | (2006.01) |

(52) U.S. Cl.
CPC ........ H01L 22/20 (2013.01); G01N 21/3504 (2013.01); H01J 37/321 (2013.01); H01J 37/32449 (2013.01); H01L 21/67069 (2013.01); H01L 21/67253 (2013.01); H01J 2237/334 (2013.01); H01L 21/3065 (2013.01); H01L 21/31116 (2013.01); H01L 21/32137 (2013.01)

(58) Field of Classification Search
CPC ............... H01L 22/20; H01L 21/67253; H01L 21/67069; H01L 21/31116; G01N 21/3504
See application file for complete search history.

(56) References Cited

U.S. PATENT DOCUMENTS

| 4,525,627 A | 6/1985 | Krempl |
| 5,352,902 A * | 10/1994 | Aoki .................. C23C 16/4412 |
| | | 250/492.2 |
| 5,463,460 A | 10/1995 | Fishkin |
| 5,830,807 A | 11/1998 | Matsunaga et al. |

(Continued)

FOREIGN PATENT DOCUMENTS

| CN | 101010446 | 8/2007 |
| CN | 102066888 | 5/2011 |
| CN | 103430010 | 12/2013 |

OTHER PUBLICATIONS

Albarede et al., U.S. Appl. No. 14/862,983, filed Sep. 23, 2015.

(Continued)

*Primary Examiner* — Kyoung Lee
*Assistant Examiner* — Christina A Sylvia
(74) *Attorney, Agent, or Firm* — Beyer Law Group LLP

(57) ABSTRACT

A method for processing a substrate in a processing chamber using at least one time trace based prediction model is provided. A substrate is dry processed, where the dry processing creates at least one gas by-product. A concentration of the at least one gas by-product is measured. A time trace of the concentration of the at least one gas by-product is determined. The determined time trace of the concentration is provided as input for the at least one time trace based prediction model to obtain at least one process output. The at least one process output is used to adjust at least one process parameter.

14 Claims, 8 Drawing Sheets

(56) References Cited

U.S. PATENT DOCUMENTS

| | | | |
|---|---|---|---|
| 5,949,537 A | | 9/1999 | Inman |
| 5,966,586 A | * | 10/1999 | Hao .................. H01J 37/32963 438/14 |
| 6,336,841 B1 | | 1/2002 | Chang et al. |
| 6,351,683 B1 | | 2/2002 | Johnson |
| 6,442,736 B1 | * | 8/2002 | Girard ...................... C23C 8/16 438/16 |
| 6,617,175 B1 | | 9/2003 | Arno |
| 6,716,477 B1 | | 4/2004 | Komiyama |
| 9,735,069 B2 | | 8/2017 | Kabouzi et al. |
| 2003/0045007 A1 | * | 3/2003 | Tanaka ................. G05B 13/048 438/5 |
| 2004/0060659 A1 | | 4/2004 | Morioka |
| 2004/0067645 A1 | | 4/2004 | Chen et al. |
| 2005/0081881 A1 | | 4/2005 | Skeidsvoll |
| 2005/0145333 A1 | | 7/2005 | Kannan |
| 2006/0139647 A1 | | 6/2006 | Tice et al. |
| 2006/0219957 A1 | | 10/2006 | Ershov |
| 2009/0014409 A1 | | 1/2009 | Grimbergen |
| 2009/0026374 A1 | | 1/2009 | Kajii |
| 2009/0045167 A1 | | 2/2009 | Maruyama |
| 2010/0114836 A1 | | 5/2010 | Chan et al. |
| 2010/0190098 A1 | | 7/2010 | Walker et al. |
| 2010/0327192 A1 | | 12/2010 | Fomenkov |
| 2012/0242989 A1 | | 9/2012 | So et al. |
| 2012/0312973 A1 | | 12/2012 | D'Costa |
| 2013/0193108 A1 | * | 8/2013 | Zheng ................. C23C 16/4404 216/59 |
| 2014/0204382 A1 | | 7/2014 | Christensen |
| 2014/0295082 A1 | | 10/2014 | Motoyama |
| 2015/0235816 A1 | * | 8/2015 | Yun .................. H01J 37/32963 156/345.25 |
| 2015/0268159 A1 | | 9/2015 | Tabaru |
| 2016/0139038 A1 | | 5/2016 | Oldsen |
| 2016/0172191 A1 | | 6/2016 | Hirano |
| 2017/0084426 A1 | | 3/2017 | Albarede et al. |
| 2017/0084503 A1 | | 3/2017 | Kabouzi et al. |
| 2017/0087606 A1 | | 3/2017 | Nakamura |
| 2017/0338160 A1 | | 11/2017 | Kabouzi |

OTHER PUBLICATIONS

Kabouzi et al., U.S. Appl. No. 14/863,211, filed Sep. 23, 2015.
Office Action from U.S. Appl. No. 14/862,983 dated Jul. 29, 2016.
Final Office Action from U.S. Appl. No. 14/862,983 dated Feb. 10, 2017.
Notice of Allowance from U.S. Appl. No. 14/862,983 dated Apr. 5, 2017.
Kabouzi et al., U.S. Appl. No. 15/667,978, filed Aug. 3, 2017.
Office Action from U.S. Appl. No. 15/667,978 dated Dec. 4, 2018.
Restriction Requirement from U.S. Appl. No. 15/691,405 dated Jul. 25, 2018.
Notice of Allowance from U.S. Appl. No. 15/691,405 dated Feb. 4, 2019.
International Search Report from International Application No. PCT/US2018/045428 dated Nov. 26, 2018.
Written Opinion from International Application No. PCT/US2018/045428 dated Nov. 26, 2018.
Office Action from U.S. Appl. No. 14/863,211 dated Jul. 17, 2018.
Restriction Requirement from U.S. Appl. No. 14/863,211 dated Feb. 16, 2018.
Final Office Action from U.S. Appl. No. 14/863,211 dated Feb. 12, 2019.
Chinese Office Action from Chinese Application No. 201610638654 dated Sep. 25, 2018.
Chinese Office Action dated May 14, 2019 from Chinese Application No. 201610638654.6.
Final Office Action from U.S. Appl. No. 15/667,978 dated Mar. 5, 2019.
Office Action from U.S. Appl. No. 15/667,978 dated Jul. 25, 2019.
Office Action from U.S. Appl. No. 14/863,211 dated Jul. 26, 2019.
Chinese Office Action from Chinese Application No. 201610824280.7 dated Jul. 31, 2019.

* cited by examiner

METHOD AND APPARATUS FOR DETERMINING ETCH PROCESS PARAMETERS

CROSS REFERENCE TO RELATED APPLICATIONS

The present disclosure is related to U.S. patent application Ser. No. 14/863,211 entitled "APPARATUS FOR DETERMINING PROCESS RATE" by Albarede et al., filed on Sep. 23, 2015 and U.S. Pat. No. 9,735,069 entitled "METHOD AND APPARATUS FOR DETERMINING PROCESS RATE" by Kabouzi et al., filed on Sep. 23, 2015 and issued on Aug. 15, 2017, which are incorporated by reference for all purposes.

BACKGROUND

The present disclosure relates to the manufacturing of semiconductor devices. More specifically, the disclosure relates to etching used in manufacturing semiconductor devices.

During semiconductor wafer processing, silicon containing layers are selectively etched. During the etching of silicon containing layers, it is desirable to measure etch rate, etch CD (critical dimension), etch profile, and etch uniformity from wafer to wafer or chamber to chamber. IR (infrared) absorption may be used to measure the concentration of a by-product produced by the etch process.

Current etch systems do not have means to measure in-situ fleet-wide, calibrated signals. In most cases, they rely on plasma emission that typically changes chamber to chamber and wet clean to wet clean, making it challenging to rely on signals to achieve in-situ metrology grade fault detection. Also, the signals that are currently available do not strongly depend on the on-wafer results, making it a weak predictor.

SUMMARY

To achieve the foregoing and in accordance with the purpose of the present disclosure, a method for processing a substrate in a processing chamber using at least one time trace based prediction model is provided. A substrate is dry processed, where the dry processing creates at least one gas by-product. A concentration of the at least one gas by-product is measured. A time trace of the concentration of the at least one gas by-product is obtained. The obtained time trace of the concentration is provided as input for the at least one time trace based prediction model to obtain at least one process output. The at least one process output is used to adjust at least one process parameter.

In another manifestation, a method to create a time trace based prediction model is provided. A plurality of substrates is dry processed, wherein the dry processing creates at least one gas by-product. A concentration of the at least one gas by-product is measured. Process parameters are recorded. A plurality of time traces of the concentration of the at least one gas by-product versus time for each substrate are obtained. Output parameters are measured. The process parameters, obtained plurality of time traces, and measured output parameters are used to create a time trace based prediction model of the at least one process output.

These and other features of the present disclosure will be described in more detail below in the detailed description of the disclosure and in conjunction with the following figures.

BRIEF DESCRIPTION OF THE DRAWINGS

The present disclosure is illustrated by way of example, and not by way of limitation, in the figures of the accompanying drawings and in which like reference numerals refer to similar elements and in which.

DETAILED DESCRIPTION OF THE PREFERRED EMBODIMENTS

Figure 1A:
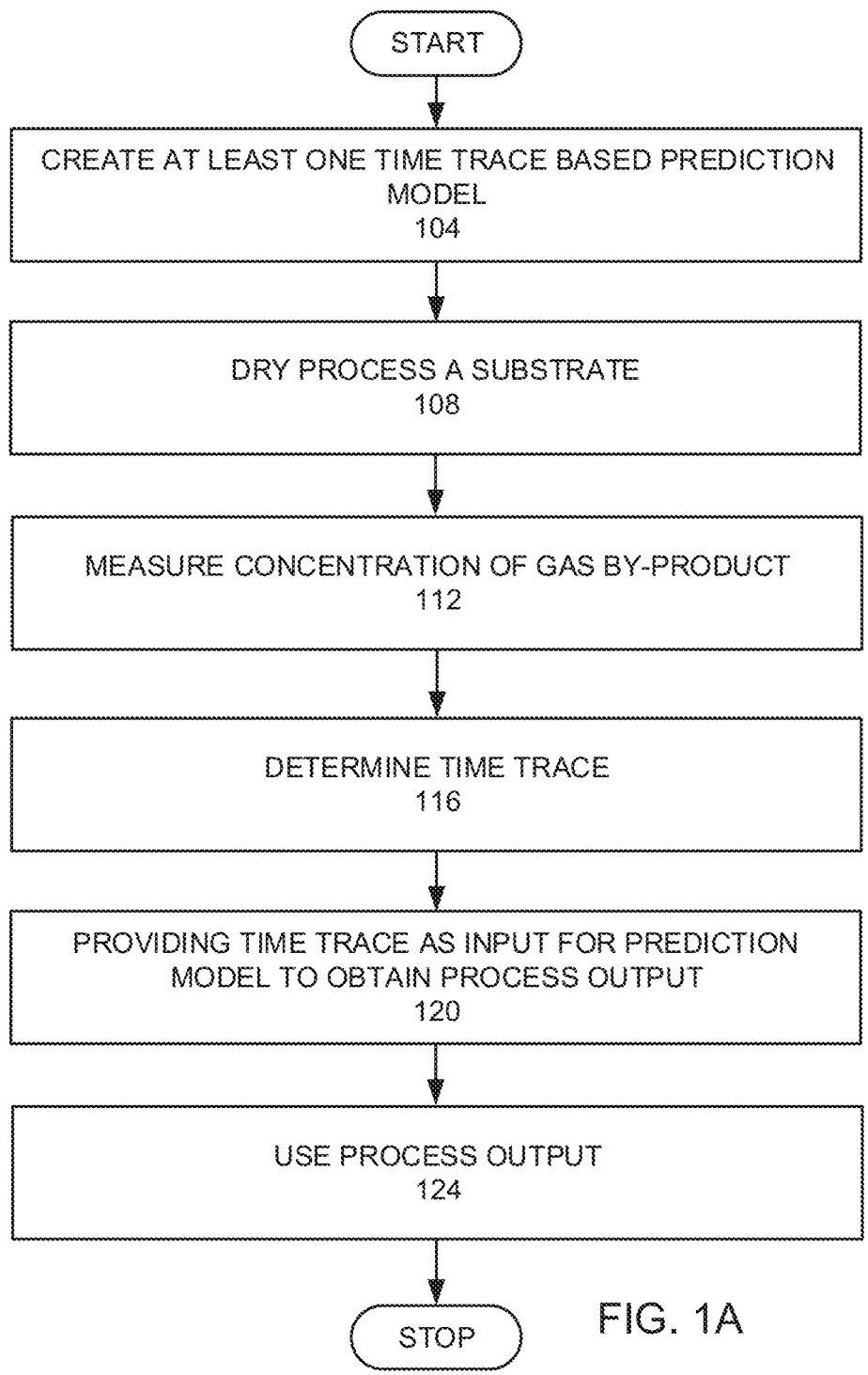
FIG. 1A is a high level flow chart of an embodiment.

The present disclosure will now be described in detail with reference to a few preferred embodiments thereof as illustrated in the accompanying drawings. In the following description, numerous specific details are set forth in order to provide a thorough understanding of the present disclosure. It will be apparent, however, to one skilled in the art, that the present disclosure may be practiced without some or all of these specific details. In other instances, well known process steps and/or structures have not been described in detail in order to not unnecessarily obscure the present disclosure.

Current technology used for process control (e.g., endpoint) relies on relative measurements or indirect measurements of plasma parameters using emission spectroscopy, reflectance, or RF (radio frequency) voltage and current. For endpoint control, optical emission spectroscopy reaches it limits with signal changes tending to zero when CDs shrink below 21 nm and aspect ratio increases beyond 30:1. For in-situ etch rate (ER) measurements, using RF voltage/current are based on correlations that are not always maintained chamber to chamber.

An embodiment relies on absolute measurements of $SiF_4$ or $SiBr_4$, or $SiCl_4$ or other $SiX_4$ by-products that are a direct by-product of most silicon containing etches (nitrides, oxides, poly, and silicon films) when using fluorocarbon based chemistries. By combining the measurements with a time trace correlation, one can predict endpoint, ER as a function of depth, average wafer selectivity, and uniformity in certain conditions. The $SiF_4$ by-products are detected using IR absorption using quantum cascade laser spectroscopy allowing parts per billion level detection for accurate predictions.

This disclosure describes a method that combines time trace correlation coupled with $SiF_4$ IR-absorption to control the etch process. The method allows the extension of endpoint capability beyond the reach of tradition methods, such as emission spectroscopy, in high-aspect ratio applications such as DRAM cell-etch and 3D-NAND hole and trench patterning. The combination of absolute density measurement and time trace correlation allows one to additionally determine in-situ etch output parameters such as ER, selectivity, CD, and uniformity that can be used to achieve run-to-run process matching.

In an embodiment, an etch process is characterized by measuring a direct stable by-product that can be: 1) Used to determine endpoint for high-aspect ratio DRAM and 3D-NAND etches for process/CD control, 2) Used to scale endpoint detection for future nodes, 3) Combined with a time trace correlation, to determine in-situ: a) Average wafer ER and ER as function of depth (ARDE), b) An average wafer uniformity and selectivity, where both measurements can be used for run-to-run matching and fault detection, 4) Used with a high sensitivity quantum cascade laser spectroscopy to achieve ppb level limit of detection needed for accurate etch endpoint and etch parameters estimation.

To facilitate understanding, FIG. 1A is a high level flow chart of a process used in an embodiment. At least one time trace based prediction model is created (step 104). A substrate is dry processed (step 108). During the dry processing, a gas by-product is created. The concentration of the gas by-product is measured (step 112). A time trace of the measured concentration of the gas by-product is obtained (step 116). The time trace is provided as input for the at least one time trace based prediction model to obtain at least one process output (step 120). The at least one process output is used to adjust at least one process parameter (step 124).

EXAMPLES

Figure 2:
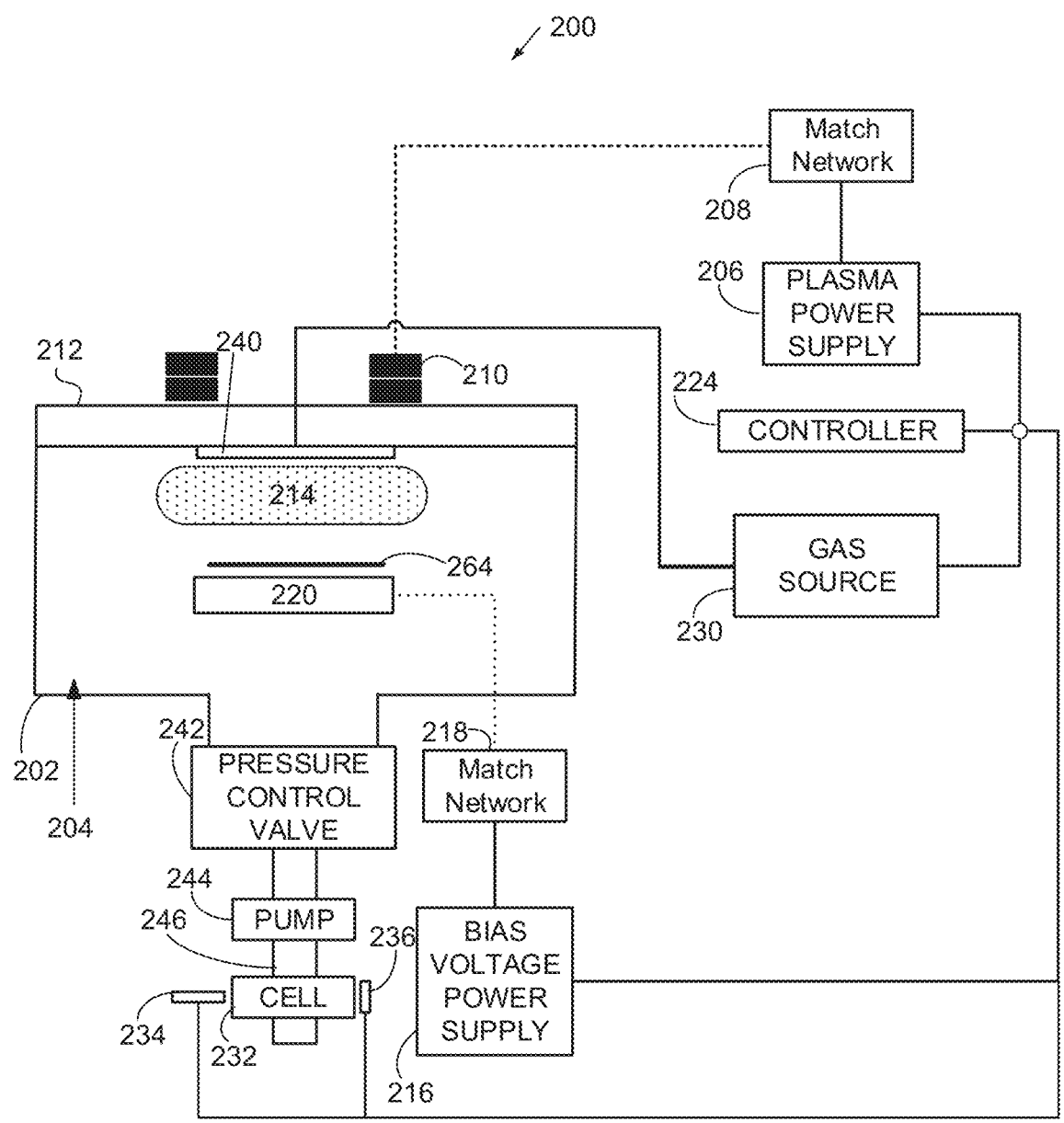
FIG. 2 is a schematic view of a plasma processing chamber that may be used in an embodiment.

In an example of an exemplary embodiment, at least one time trace based prediction model is created (step 104). FIG. 2 schematically illustrates an example of a plasma processing chamber 200, which may be used to create the at least one time trace based prediction model. In various embodiments, several plasma processing chambers 200 may be used in creating the at least one time trace based prediction model. The plasma processing chamber 200 includes a plasma reactor 202 having a plasma processing confinement chamber 204 therein. A plasma power supply 206, tuned by a match network 208, supplies power to a TCP coil 210 located near a power window 212 to create a plasma 214 in the plasma processing confinement chamber 204 by providing an inductively coupled power. The TCP coil (upper power source) 210 may be configured to produce a uniform diffusion profile within the plasma processing confinement chamber 204. For example, the TCP coil 210 may be configured to generate a toroidal power distribution in the plasma 214. The power window 212 is provided to separate the TCP coil 210 from the plasma processing confinement chamber 204 while allowing energy to pass from the TCP coil 210 to the plasma processing confinement chamber 204. A wafer bias voltage power supply 216 tuned by a match network 218 provides power to an electrode 220 to set the bias voltage on the substrate 264 which is supported by the electrode 220. A controller 224 sets points for the plasma power supply 206, gas source/gas supply mechanism 230, and the wafer bias voltage power supply 216.

The plasma power supply 206 and the wafer bias voltage power supply 216 may be configured to operate at specific radio frequencies such as, for example, 13.56 MHz, 27 MHz, 2 MHz, 60 MHz, 200 kHz, 2.54 GHz, 400 kHz, and 1 MHz, or combinations thereof. Plasma power supply 206 and wafer bias voltage power supply 216 may be appropriately sized to supply a range of powers in order to achieve desired process performance. For example, in one embodiment, the plasma power supply 206 may supply the power in a range of 50 to 5000 Watts, and the wafer bias voltage power supply 216 may supply a bias voltage in a range of 20 to 2000 V. For a bias voltage up to 4 kV or 5 kV a power of no more than 25 kW is provided. In addition, the TCP coil 210 and/or the electrode 220 may be comprised of two or more sub-coils or sub-electrodes, which may be powered by a single power supply or powered by multiple power supplies.

As shown in FIG. 2, the plasma processing chamber 200 further includes a gas source/gas supply mechanism 230. The gas source/gas supply mechanism 230 is in fluid connection with plasma processing confinement chamber 204 through a gas inlet, such as a shower head 240. The gas inlet may be located in any advantageous location in the plasma processing confinement chamber 204, and may take any form for injecting gas. Preferably, however, the gas inlet may be configured to produce a "tunable" gas injection profile, which allows independent adjustment of the respective flow of the gases to multiple zones in the plasma process confinement chamber 204. The process gases and by-products are removed from the plasma process confinement chamber 204 via a pressure control valve 242 and a pump 244, which also serve to maintain a particular pressure within the plasma processing confinement chamber 204. The gas source/gas supply mechanism 230 is controlled by the controller 224. A Kiyo® tool made by Lam Research Corp. of Fremont, Calif., may be used to practice an embodiment. In other examples, a Flex™ tool made by Lam Research Corp. of Fremont, Calif., may be used to practice an embodiment.

In this embodiment, connected to an exhaust pipe 246 after the pump 244, a gas cell 232 is provided, into which exhaust gas flows. An IR light source 234 is positioned adjacent to a window in the gas cell 232, so that an IR beam from the IR light source 234 is directed into the gas cell 232. The IR beam can travel through the gas cell 232 multiple times (typically >1 m) to achieve ppb level or even lower hundredth of ppt detection limits, so that the gas cell 232 is a multi-pass gas cell. The IR light is absorbed by the gas as it travels inside the gas cell 232. An IR detector 236 is positioned adjacent to another window in the gas cell 232 to measure the light absorption level.

Figure 3:
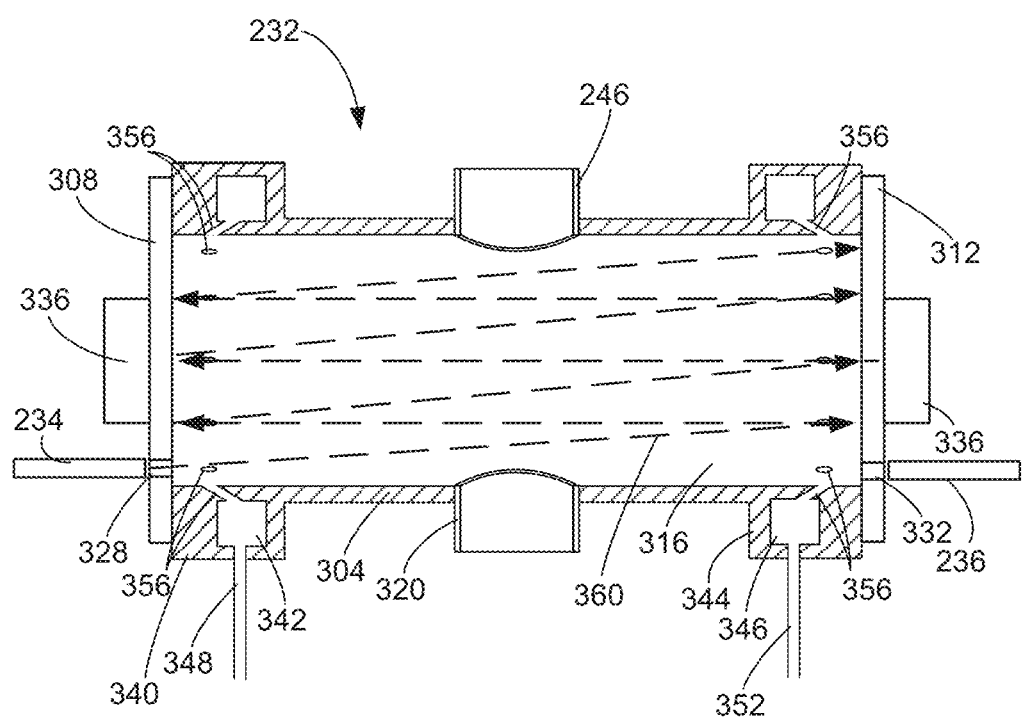
FIG. 3 is a more detailed schematic view of a gas cell of the embodiment, shown in FIG. 2.

FIG. 3 is a more detailed schematic view of the gas cell 232 of the embodiment, shown in FIG. 2. The exhaust pipe 246 extends from the output of pump 244. The gas cell 232 comprises a gas chamber 304, a first mirror 308, and a second mirror 312. The gas chamber 304, the first mirror 308, and the second mirror 312 define an optical cavity 316. The exhaust pipe 246 causes exhaust to flow into the optical cavity 316 in the gas chamber 304 and then out of the optical cavity 316 through an output port 320. In this embodiment, the flow of the exhaust into and out of the optical cavity 316 is along a linear path. An IR light source 234, which in this embodiment is a quantum cascade laser (QCL) IR light source, is provided adjacent to a window 328 in the first mirror 308. An output fiber 332 is optically connected between an IR detector 236 and the optical cavity 316 through the second mirror 312. The light can be coupled directly into the gas cell 232 or through optical fibers. Heaters 336 are placed adjacent to the first mirror 308 and the second mirror 312. One or more of the heaters 336 may have heat sensors. The heaters 336 may be electrically connected to and controlled by the controller 224 and may provide temperature data to the controller 224. A first purge ring 340 with a first purge ring channel 342 and a second purge ring 344 with a second purge ring channel 346 are provided, which surround the gas chamber 304. The first purge ring 340 is adjacent to the first mirror 308 and has a first purge gas input 348. The second purge ring 344 is adjacent to the second mirror 312 and has a second purge gas input 352. The first purge ring 340 and the second purge ring 344 are in fluid communication with the gas cell 232 and optical cavity 316 through a plurality of purge gas nozzles 356.

Figure 4:
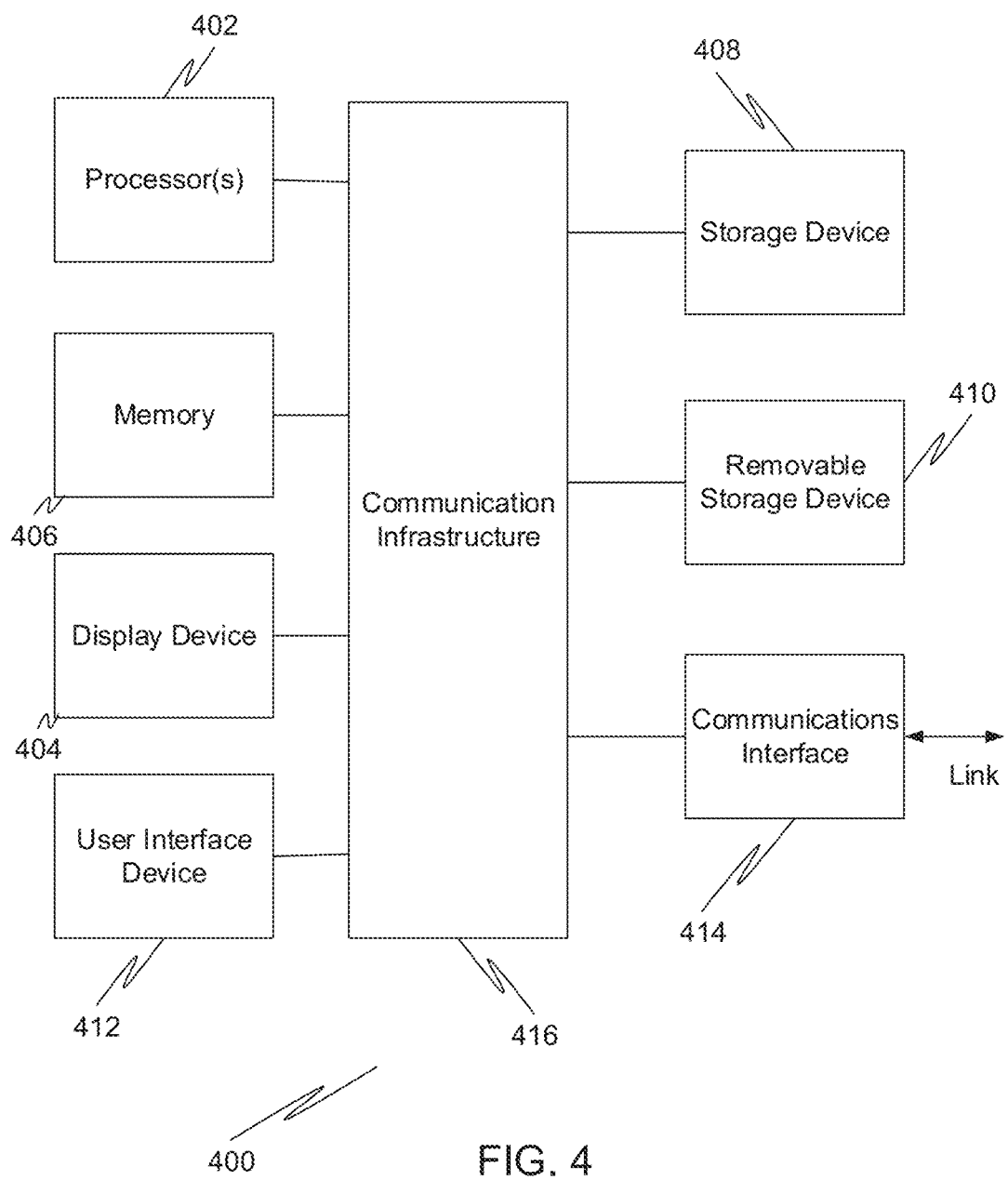
FIG. 4 is a computer system that may be used in an embodiment.

FIG. 4 is a high level block diagram showing a computer system 400, which is suitable for implementing a controller 224 used in embodiments. The computer system may have many physical forms ranging from an integrated circuit, a printed circuit board, and a small handheld device, up to a huge super computer. The computer system 400 includes one or more processors 402, and further can include an electronic display device 404 (for displaying graphics, text, and other data), a main memory 406 (e.g., random access memory (RAM)), storage device 408 (e.g., hard disk drive), removable storage device 410 (e.g., optical disk drive), user interface devices 412 (e.g., keyboards, touch screens, keypads, mice or other pointing devices, etc.), and a communication interface 414 (e.g., wireless network interface). The communication interface 414 allows software and data to be transferred between the computer system 400 and external devices via a link. The system may also include a communications infrastructure 416 (e.g., a communications bus, cross-over bar, or network) to which the aforementioned devices/modules are connected.

Information transferred via communications interface 414 may be in the form of signals such as electronic, electromagnetic, optical, or other signals capable of being received by communications interface 414, via a communication link that carries signals and may be implemented using wire or cable, fiber optics, a phone line, a cellular phone link, a radio frequency link, and/or other communication channels. With such a communications interface, it is contemplated that the one or more processors 402 might receive information from a network, or might output information to the network in the course of performing the above-described method steps. Furthermore, method embodiments may execute solely upon the processors or may execute over a network such as the Internet in conjunction with remote processors that shares a portion of the processing.

The term "non-transient computer readable medium" is used generally to refer to media such as main memory, secondary memory, removable storage, and storage devices, such as hard disks, flash memory, disk drive memory, CD-ROM, and other forms of persistent memory and shall not be construed to cover transitory subject matter, such as carrier waves or signals. Examples of computer code include machine code, such as produced by a compiler, and files containing higher level code that are executed by a computer using an interpreter. Computer readable media may also be computer code transmitted by a computer data signal embodied in a carrier wave and representing a sequence of instructions that are executable by a processor.

Figure 1B:
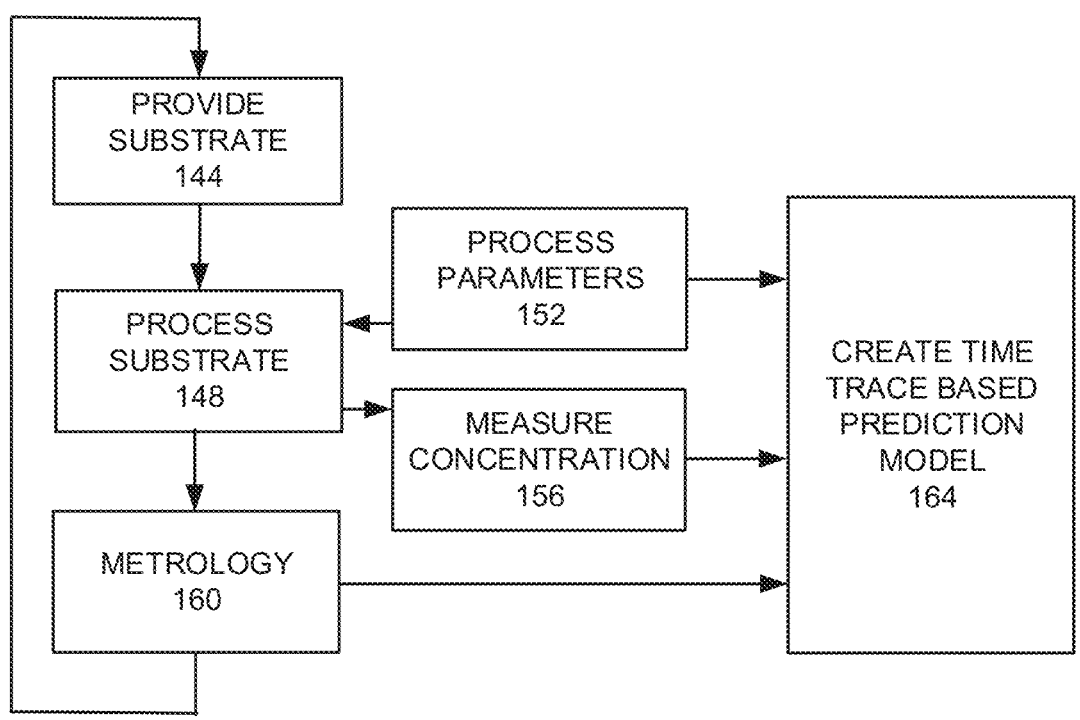
FIG. 1B is a flow chart of creating at least one time trace based prediction model.

FIG. 1B is a flow chart that is used to create at least one time trace based prediction model (step 104), in an embodiment. A substrate is provided in a plasma processing chamber 200 (step 144). The substrate is processed (step 148). Process parameters, which are recorded, are used to control the processing of the substrate (step 152). The concentration of a gas by-product is measured (step 156). When the processing is completed, the substrate is measured in a metrology tool (step 160), which provides measured output parameters. The process is carried out for a plurality of substrates. The process parameters, measured concentrations, and measured output parameters are used to create a time trace based prediction model. A multi-variate method is used to create the time trace based prediction model, which correlates process parameters and measured output parameters with the time trace of the concentration of the gas by-product. The multi-variate method may use a neural network, such as a recurrent neural network (RNN) or a variant of RNN known as Long Short Term Memory neural networks (LSTM), or a multivariable analysis, such as partial least squares (PLS). Such a model would use not just a magnitude or a slope of the time trace of the concentration, but the dynamics of the time trace of the concentration, which includes magnitude, ratio of magnitude, curvature, lump sum of absorption values, and slope over the full time trace. In some embodiments, the dynamics of the time trace also uses the phase space of the time trace [s(t), s'(t)].

Figure 5:
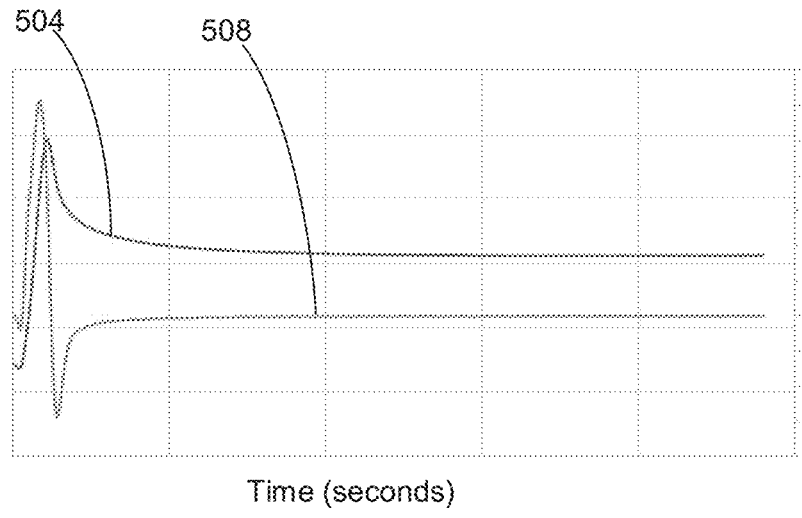
FIGS. 5A-B are time trace graphs.
Figure 5:
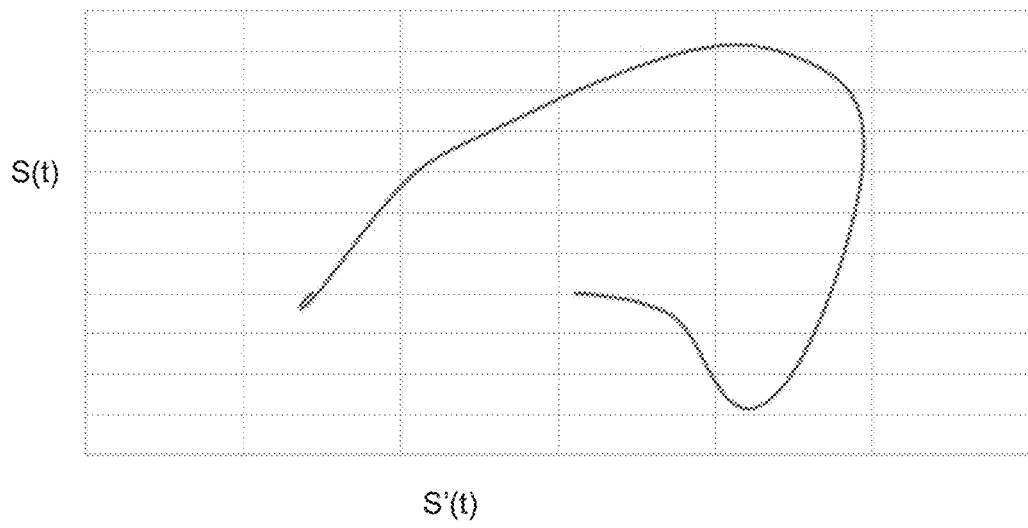
Figure 6:
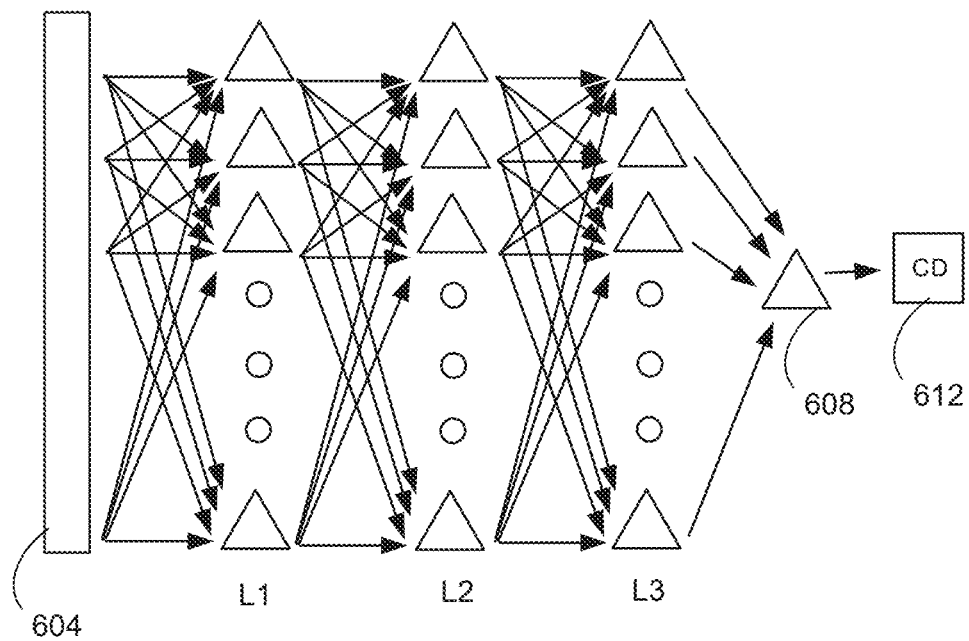
FIG. 6 is a schematic view of a recurrent neural network model used in an embodiment.

In an example, a full time trace s(t) of the concentration of by-product is graphed with respect to time. FIG. 5A is a graph of s(t) 504. In addition, the derivative of s(t) with respect to time s'(t) is also graphed 508. FIG. 5B is a two dimensional phase space graph of s(t) versus s'(t) of the time trace shown in FIG. 5A. FIG. 6 is a schematic view of a Neural Network (NN) with memory that is used in this embodiment. The NN is provided different types of data 604, which, in this example, falls in three categories, which are by-product time trace, process parameters, and measured output parameters. Process parameters are process inputs, which may include gas flow, RF power, bias voltage, or chamber characteristics, which influence process output. Measured output parameters may include etch rate, uniformity, CD, etch profile, wet clean, etch performance, or chamber cleaning performance. The data is provided to the input layers of the NN in various layers, the NN is a simple feedforward with 3 hidden layers connecting input time traces, process input to the output layer predicting wafer parameters. The different layers model different attributes of the by-product concentration time trace. For example, L1 may be the magnitude of the concentration, L2 may be the curvature of the time trace, and L3 may be the ratio of adjacent magnitudes of the time trace. The NN produces a predictive model, which is used to predict an output 608, which, in this example, may predict CD. In various embodiments, a plurality of time trace based prediction models may be created and/or used. For example, a time trace based prediction model of CD may be created and used and a time trace based prediction model of etch rate may be created and used. In an example, N time traces may be used to create a model with M outputs, where the M outputs may be CD, etch rate, or electrical yield and where N>>M. To provide a greater number of outputs would involve a greater number of layers or components of the PLS or NN. Therefore, a prediction model may have two, three, or even more process outputs.

The model outputs such as CD/ER may be used to create upper and lower limits to monitor in-situ process performance or used to provide a feedback for an advanced process control algorithm to adjust process parameters for the subsequent substrates. During the processing of a substrate, a time trace may be used to determine whether a process is exceeding the upper or lower limits of the CD or the upper or lower limits of the ER.

Figure 7:
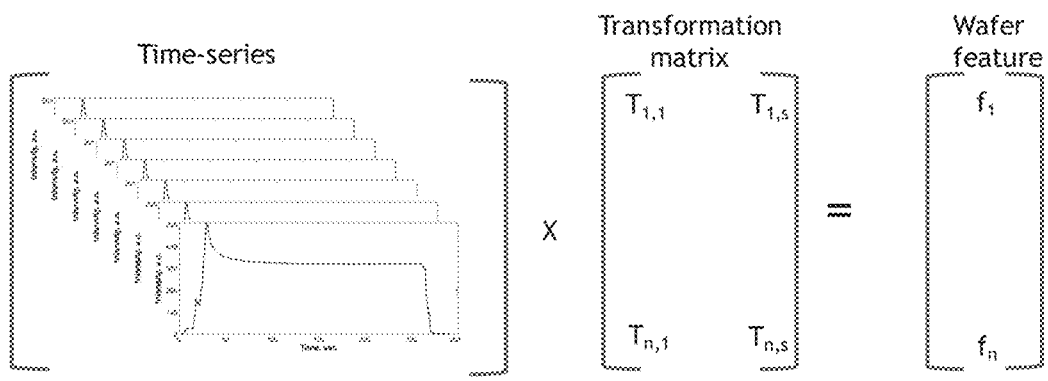
FIG. 7 is a schematic illustration of how a plurality of time traces may be used to create a transformation matrix or coefficients of the regression, for a prediction model.
Figure 8:
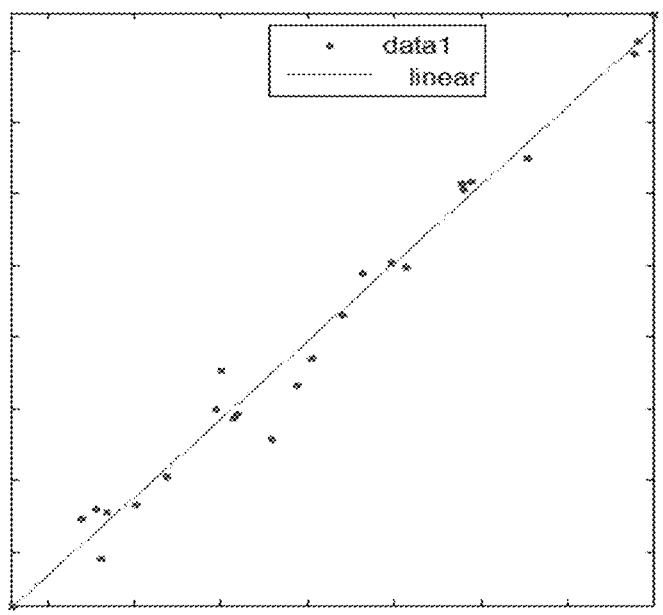
FIG. 8 is a plot of measured Predicted CD to Measured CD.

In another example, a PLS method is used to correlate the CD to a part or the full $SiF_4$ time evolution in order to create a time trace based prediction model. FIG. 7 is a schematic illustration of how a plurality of time traces may be used to create a transformation matrix or coefficients of the regression, for a prediction model. Data from the plurality of time traces is provided in a matrix (X). The resulting wafer features are also placed in a matrix (F). A transformation matrix (β) may be calculated using a partial least squares method such that F=βX+ε, where E is an error term. FIG. 8 compares the predicted CD versus the measured CD. In this example, multiple $SiF_4$ time traces are recorded for different ER conditions leading to different etch feature CD outputs on the wafer. A model is generated by regressing the CD values onto the $SiF_4$ time traces. The resulting correlation between the model simulated CD and the measured one is better than 98%.

A dry process is performed on the substrate (step 108) in the processing chamber, where the dry process creates at least one gas by-product. In different embodiments, either the substrate is a silicon wafer, which is etched or one or more silicon containing layers over the substrate are etched. In this example, a stack of alternating silicon oxide and silicon nitride layers is etched. Such an alternating stack of silicon oxide and silicon nitride is designated as ONON, which is used in 3D memory devices. In this example, there are at least eight alternating layers of ONON. In etching such a stack, both ER and selectivity decrease with aspect ratio, meaning that the difference between etch rates of the silicon oxide and silicon nitride decreases as aspect ratio, the ratio of the etch depth over the etch width, increases. To etch such a stack, an etch gas of $C_xF_yH_z/O_2$ is provided by the gas source/gas supply mechanism 230. RF power is provided by the plasma power supply 206 to the TCP coil 210 to form the etch gas into an etch plasma, which etches the stack and forms at least one gas by-product, which in this example is $SiF_4$. (Other etch by-products such as $SiBr_4$ or $SiCl_4$ can be monitored depending on the gas chemistry by tuning the IR light source to the absorption band of each by-product.)

During the dry process, the concentration of the at least one gas by-product is measured over time (step 112). In this embodiment, exhaust from the pump 244 flows to the gas cell 232. The IR light source 234 provides a beam of IR light into the gas cell 232. The first mirror 308 and the second mirror 312 reflect the beam of IR light a plurality of times before the beam of IR light is directed to the IR detector 236, which measures the intensity of the beam of IR light. The optical path length of the IR beam can reach few meters to few hundreds of meters, thus allowing for sub ppb detection limit. In an embodiment, the optical path is at least one meter. Data from the IR detector 236 is sent to the controller 224, which uses the data to determine the concentration of the $SiF_4$.

At the completion of the etch, a time trace is obtained for the time evolution of the concentration of etch by-product (step 116). The time trace is then used as input for the prediction model to determine on-wafer process result or process output (step 120), such as CD. The process output is used to adjust at least one process parameter (step 124). For example, the CD values can be fed to a host for advanced process control, allowing it to feedforward gas flow, power or time to adjust for the next substrate or next lot of substrates CD output. In one example, the process output may show that the CD is above a set threshold. As a result, a process parameter may be instantly changed to correct the CD. In one example, the $O_2$ flow is tuned to adjust the ratio of etch to polymer deposition. In another embodiment, a process parameter may be adjusted after the process is completed to change the process for the next substrate.

In this example, a relationship between a process parameter and by-product concentration has been determined with a high degree of accuracy and without sophisticated analysis or modeling. Such a relationship was not previously known, so that previously an expensive and time consuming metrology process was required in order to determine CD. In an example, after few wafers are processed and measured by metrology, a model may be provided between the time trace of absorbance and the CD outputs. When the model is established and confirmed, the CD outputs at the end of the wafer process can be predicted, without waiting for the metrology tool feedback. Waiting for metrology tool feedback can take multiple hours before the data is available, which may result in multiple lot scrap. Here, by having the reliable CD model in real time, the process can be adjusted and wafer to wafer control is achieved. The process allows for the process outputs to be provided in real time, so that adjustments may be made in real time. Such real time adjustments are defined as either being made while the wafer being measured is still being processed, or before the next wafer is processed, without a pause between wafers to provide analysis.

In other embodiments, time trace based prediction models between time trace and bottom CD, top CD, etch rate, feature bowing, yield rate, wafer auto clean (WAC) process, etch uniformity, wet clean parameters, chamber clean parameters, or chamber features may be determined. The time trace based prediction models may be used to establish upper and lower thresholds or limits. When the limits are exceeded, either parameters for a current dry process may be changed to facilitate the current dry process, or a parameter may be changed for a future dry process. One example of a parameter change for a future process may result from a determination that an etch profile is out of specification to an extent that a chamber needs to be adjusted or cleaned. The comparison of the time trace with the time trace based prediction model would be used to indicate how the chamber needs to be adjusted. For example, the comparison may indicate that the chamber needs a wet cleaning. As a result, the chamber would be subjected to a wet clean. Such a determination is made, during the dry processing of a substrate, without requiring performing an expensive and time consuming metrology on the substrate and without processing several substrates out of specification, before determining that a cleaning is needed. The comparison may be used for advanced fault detection to determine run-to-run and chamber-to-chamber performance. An embodiment may use the time traces as input for time trace based prediction models during the processing of a plurality of substrates in succession to measure the chamber drift from specification to determine an optimal time for readjusting or reconditioning the chamber.

In various embodiments, the dynamics of a time trace are used. The use of the dynamics of a time trace uses more than just a magnitude versus time. Such dynamics would also use the time derivative of the time trace. More preferably, such dynamics also use curvature of the time trace. Most preferably, such dynamics also use ratios of magnitudes and other features. The dynamics may also use one dimensional or two dimensional phase space graphs of the time trace.

In an experiment, a measured absorption had two contributors: the wafer and the chamber. Three-fourths of the absorption was attributed to the chamber since it has the largest area in contact with the plasma. The other one-fourth was attributed to the wafer. By assuming that the wafer attribution is constant over time or has a very small variation, it can be assumed that any change over time is due to a change in the chamber attribution. The change may be attributed to parts erosion. This embodiment provides an indication in real time of chamber part erosion.

In another embodiment, the level of absorbance is measured during a waferless auto clean (WAC). Again, there are two respective contributions from the polymer and the chamber. Near the end of WAC, the chamber is clean, so the only contribution left is the contribution from the chamber. Monitoring the value of absorbance at the end of each WAC over wet cleans will provide the chamber clean fingerprint. The absorption in the foreline is where the measurement is made.

It has been unexpectedly found that such methods are successful when concentrations can be measured with an accuracy of parts per billion (ppb) and more preferably parts per trillion (ppt). For low pressure plasma processing systems, it has been found that a post exhaust gas cell, which measures absorption after light has passed through the gas cell a plurality of times to provide a light path of greater than 1 meter provides the required accuracy. Advantages of placing the gas cell after the exhaust pump are that the gas is denser after the exhaust pump than the gas in the processing chamber. In addition, reflective surfaces are not exposed to the plasma in the processing chamber, so that reflective surfaces would not be degraded by plasma radicals or ions. In other embodiments, the gas cell is in the plasma processing chamber, such as surrounding the plasma region where the plasma is at a higher pressure. In other embodiments, visible light or UV light may be used instead of IR light.

Various embodiments are useful for etching memory devices such as DRAM and 3D-NAND devices. In various embodiments, the plasma process is an etch process of a silicon containing layer or a low-k dielectric layer. In various embodiments, the RF power may be inductively coupled or capacitively coupled. A Flex™ tool made by Lam Research Corp. of Fremont, Calif., may be used to practice an embodiment with capacitive coupling to etch DRAM and 3D NAND structures. In other embodiments, other types of plasma power coupling may be used. In other embodiments, alternating layers of silicon oxide and polysilicon (OPOP) may be etched.

While this disclosure has been described in terms of several preferred embodiments, there are alterations, permutations, modifications, and various substitute equivalents, which fall within the scope of this disclosure. It should also be noted that there are many alternative ways of implementing the methods and apparatuses of the present disclosure. It is therefore intended that the following appended claims be interpreted as including all such alterations, permutations, and various substitute equivalents as fall within the true spirit and scope of the present disclosure.

What is claimed is:

1. A method for processing a substrate in a processing chamber using at least one time trace based prediction model, comprising:
dry processing a substrate, wherein the dry processing creates at least one gas by-product;
measuring a concentration of the at least one gas by-product, wherein the concentration of the at least one gas by-product is measured based on light absorption, wherein the concentration of the at least one gas by-product is measured using a multi-pass gas cell with an optical path length of at least one meter, wherein the at least one gas by-product is measured after the at least one gas by-product has passed through an exhaust pump, by placing the multi-pass gas cell on an output side of the exhaust pump;
obtaining a time trace of the concentration of the at least one gas by-product;
providing the obtained time trace of the concentration as input for the at least one time trace based prediction model to obtain at least one process output; and
using the at least one process output to adjust at least one process parameter, wherein the using the at least one process output to adjust at least one process parameter uses the at least one process output to adjust the at least one process parameter in real time.

2. The method, as recited in claim 1, wherein the at least one time trace based prediction model is based on a multivariate method.

3. The method, as recited in claim 1, further comprising calculating a lump sum of absorption values from the obtained time trace of the concentration.

4. The method, as recited in claim 1, wherein the at least one time trace based prediction model is further based on at least one of etch rate, uniformity, critical dimension, etch profile, wet clean, etch performance, chamber matching, and chamber cleaning performance.

5. The method, as recited in claim 1, wherein the using the at least one process output comprises determining a change in at least one of etch rate, uniformity, critical dimension, and etch profile.

6. The method, as recited in claim 1, wherein the using the at least one process output comprises determining if at least one of etch rate, uniformity, CD, and etch profile is out of specification.

7. A method for processing a substrate in a processing chamber using at least one time trace based prediction model, comprising:
dry processing a substrate, wherein the dry processing creates at least one gas by-product;
measuring a concentration of the at least one gas by-product, wherein the concentration of the at least one gas by-product is measured based on light absorption, wherein the concentration of the at least one gas by-product is measured using a multi-pass gas cell with an optical path length of at least one meter, wherein the at least one gas by-product is measured after the at least one gas by-product has passed through an exhaust pump, by placing the multi-pass gas cell on an output side of the exhaust pump;
obtaining a time trace of the concentration of the at least one gas by-product;
providing the obtained time trace of the concentration as input for the at least one time trace based prediction model to obtain at least one process output, wherein the at least one process output includes at least two process outputs; and
using the at least one process output to adjust at least one process parameter.

8. A method for processing a substrate in a processing chamber using at least one time trace based prediction model, comprising:
dry processing a substrate, wherein the dry processing creates at least one gas by-product;
measuring a concentration of the at least one gas by-product;
obtaining a time trace of the concentration of the at least one gas by-product;
providing the obtained time trace of the concentration as input for the at least one time trace based prediction model to obtain at least one process output; and
using the at least one process output to adjust at least one process parameter, wherein the using the at least one process output to adjust at least one process parameter, comprises using the time trace based prediction model to determine an upper process limit and a lower process limit and comparing the at least one process output to the upper process limit and the lower process limit.

9. A method for processing a substrate in a processing chamber using at least one time trace based prediction model, comprising:
- dry processing a substrate, wherein the dry processing creates at least one gas by-product;
- measuring a concentration of the at least one gas by-product, wherein the concentration of the at least one gas by-product is measured based on light absorption, wherein the concentration of the at least one gas by-product is measured using a multi-pass gas cell with an optical path length of at least one meter, wherein the at least one gas by-product is measured after the at least one gas by-product has passed through an exhaust pump, by placing the multi-pass gas cell on an output side of the exhaust pump, wherein the measuring the concentration of the at least one gas by-product measures the at least one gas by-product with an accuracy of parts per trillion;
- obtaining a time trace of the concentration of the at least one gas by-product;
- providing the obtained time trace of the concentration as input for the at least one time trace based prediction model to obtain at least one process output; and
- using the at least one process output to adjust at least one process parameter.

10. A method of creating a time trace based prediction model, comprising:
- dry processing a plurality of substrates using process parameters, wherein the dry processing creates at least one gas by-product;
- measuring a concentration of the at least one gas by-product, wherein the concentration of the at least one gas by-product is measured based on light absorption, wherein the concentration of the at least one gas by-product is measured using a multi-pass gas cell with an optical path length of at least one meter, wherein the at least one gas by-product is measured after the at least one gas by-product has passed through an exhaust pump, by placing the multi-pass gas cell on an output side of the exhaust pump, wherein the measuring the concentration of the at least one gas by-product measures the at least one gas by-product with an accuracy of parts per trillion;
- recording the process parameters;
- obtaining a plurality of time traces of the concentration of the at least one gas by-product versus time for each substrate;
- measuring output parameters; and
- using the process parameters, obtained plurality of time traces, and measured output parameters to create a time trace based prediction model of at least one process output.

11. The method, as recited in claim 10, wherein the at least one gas by-product comprises a silicon containing gas.

12. The method, as recited in claim 10, wherein the using the process parameters, obtained plurality of time traces, and measured output parameters to create the time trace based prediction model of at least one process uses at least one of multivariable analysis or neural networking.

13. The method, as recited in claim 10, wherein the at least one process output includes at least one of etch rate, uniformity, critical dimension, etch profile, wet clean, etch performance, chamber matching, and chamber cleaning performance.

14. A method of creating a time trace based prediction model, comprising:
- dry processing a plurality of substrates using process parameters, wherein the dry processing creates at least one gas by-product;
- measuring a concentration of the at least one gas by-product, wherein the concentration of the at least one gas by-product is measured based on light absorption, wherein the concentration of the at least one gas by-product is measured using a multi-pass gas cell with an optical path length of at least one meter, wherein the at least one gas by-product is measured after the at least one gas by-product has passed through an exhaust pump, by placing the multi-pass gas cell on an output side of the exhaust pump;
- recording the process parameters;
- obtaining a plurality of time traces of the concentration of the at least one gas by-product versus time for each substrate;
- measuring output parameters; and
- using the process parameters, obtained plurality of time traces, and measured output parameters to create a time trace based prediction model of at least one process output, wherein the at least one process output includes at least two process outputs.

* * * * *